Dec. 1, 1959 J. A. WORCESTER, JR 2,915,625

SCAN TUNING RECEIVER

Filed Aug. 25, 1953 4 Sheets-Sheet 1

Inventor:
Joseph A. Worcester, Jr.
by Charles M. Hutchins
His Attorney.

Inventor:
Joseph A. Worcester, Jr.
by Charles M. Hutchins
His Attorney.

Dec. 1, 1959 J. A. WORCESTER, JR 2,915,625

SCAN TUNING RECEIVER

Filed Aug. 25, 1953 4 Sheets-Sheet 3

Inventor:
Joseph A. Worcester, Jr.
by Charles M. Hutchins
His Attorney.

Dec. 1, 1959 J. A. WORCESTER, JR 2,915,625

SCAN TUNING RECEIVER

Filed Aug. 25, 1953 4 Sheets-Sheet 4

Inventor:
Joseph A. Worcester. Jr.
by Charles M. Hutchins
His Attorney.

United States Patent Office 2,915,625

Patented Dec. 1, 1959

2,915,625

SCAN TUNING RECEIVER

Joseph A. Worcester, Jr., Syracuse, N.Y., assignor to General Electric Company, a corporation of New York Application August 25, 1953, Serial No. 376,348

2 Claims. (Cl. 250—20)

This invention relates to an improved signal-seeking receiver.

If a receiver of this type is equipped with an automatic volume control circuit, the gain of the receiver is reduced as the receiver is tuned to a signal. If the signal energy just exceeds the minimum required to cause the tuner to lock, any reduction in gain caused by the A.V.C. circuit may reduce the gain of the receiver to such an extent that the tuner will not stay locked on the signal.

Therefore, it is an object of the invention to provide means for disabling the A.V.C. circuit unless the received signal has sufficient strength to lock the tuning of the receiver when the A.V.C. circuit is in operation.

In receivers of this type the signal must have a predetermined energy level before it is capable of stopping the tuning means. Some signals are such that they just exceed this energy level during certain times and fade below it on others. During such a fade the scan tuning means may continue operation until another signal of a different frequency is received.

Accordingly, it is an object of the present invention to provide an improved means for scan tuning a receiver in such manner that the tuning means only locks onto signals that it can stay locked on even when the signals fade to some extent.

This objective may be attained by providing means for temporarily reducing the gain of the receiver during the time the tuner is scanning. After a period of sufficient duration to permit the tuner to complete its scan, the gain of the receiver is restored.

In some scan tuning receivers a frequency discriminator merely stops the scan tuner and exerts no control on the tuning. Variations in the values of components of the receiver may mistune the receiver so that the signal falls below the level necessary to maintain the scan tuner in a locked position, in which event the tuner resumes its scanning.

Accordingly it is another object of this invention to provide a scan tuning arrangement wherein the output of a discriminator not only locks the tuner on a desired signal but also provides automatic frequency control.

It is a further object to provide a scan tuner in which the frequency discriminator exerts automatic frequency control and at the same time locks the tuner on a desired signal in such manner that extra components are not required.

It is known that the inductance of a coil wound on a magnetic core can be changed by altering the amount of D.C. flux within the core. The D.C. flux can be altered by changing the direct current flowing in the coil. However, the coil must have characteristics required by circuits in which it is used as well as be capable of producing the proper amount of D.C. flux. Therefore, it has been suggested that a separate saturation winding be mounted on the core for establishing the D.C. flux. If the coil is part of a tuning circuit of a receiver, it is apparent that the signal frequency to which the receiver is responsive may be determined by the amount of D.C.

current caused to flow in the saturation winding. In previous receiver tuning arrangements the amount of D.C. current flowing in the winding has been manually controlled.

It is a further object of this invention to provide a novel arrangement for gradually changing the amount of D.C. flux in the core by automatic means and for locking the tuner when a signal is received.

Generally, it is desired that means be provided for indicating the frequency to which the receiver is tuned. An indication of this frequency can be obtained by providing a device for measuring the amount of current flowing in the saturation winding. However, due to the hysteresis of the core material, the same amount of current can produce different amounts of flux and hence tune the receiver to different frequencies. For this reason, frequency indicating means have been provided that are responsive to the actual flux in the core instead of being responsive to current flowing in the saturation winding that produces the flux. However, such tuning indicator is generally too expensive and complicated.

Accordingly, it is another object of the invention to provide a simple inexpensive tuning indicator for use with a tuning means of the type set forth above.

This objective may be attained by providing an indicator of the current flowing in the saturation winding. The effects of hysteresis are avoided by gradually changing the current in the saturation winding from a first value to the second during the several seconds of the frequency scanning cycle and rapidly changing the current back from the second value to the first inbetween scanning cycles. Provision is made for preventing the tuner from locking on any signal in between scanning cycles. In this way, the tuner always operates on one side of the hysteresis loop of the core material when the locking mechanism is operative. Hence a given current always indicates the same frequency.

The manner in which these various objectives as well as other advantages may be attained in accordance with the principles of this invention will be better understood after the following discussion of the drawings in which.

Figure 1:
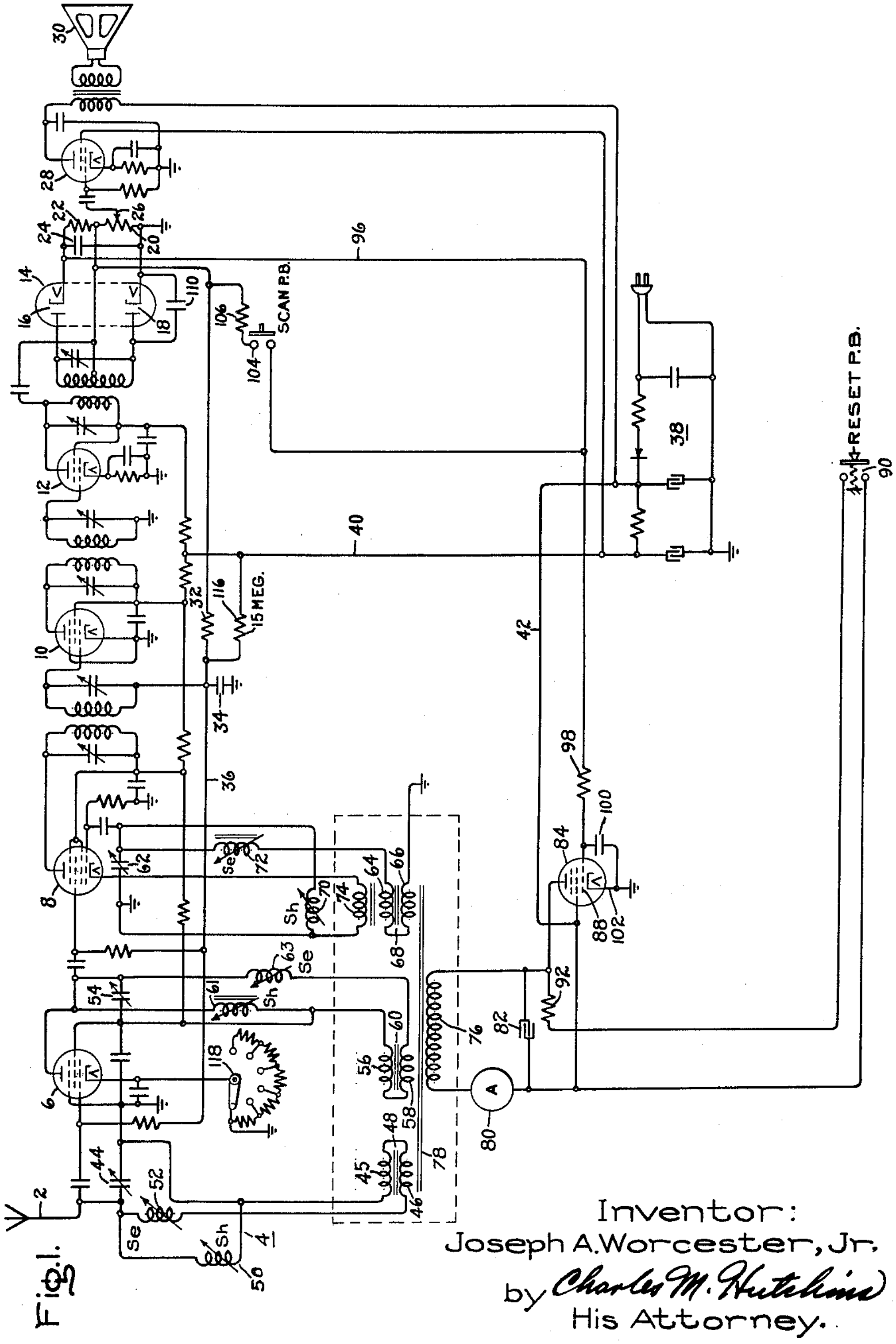
Figure 1 is a schematic diagram of a receiver provided with a scan tuner constructed in accordance with the principles of this invention.
Figure 2:
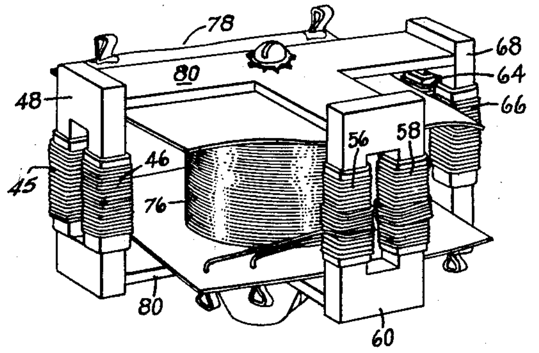
Figure 2 illustrates one way of constructing a saturable tuner for use in the receiver of Figure 1.
Figure 3:
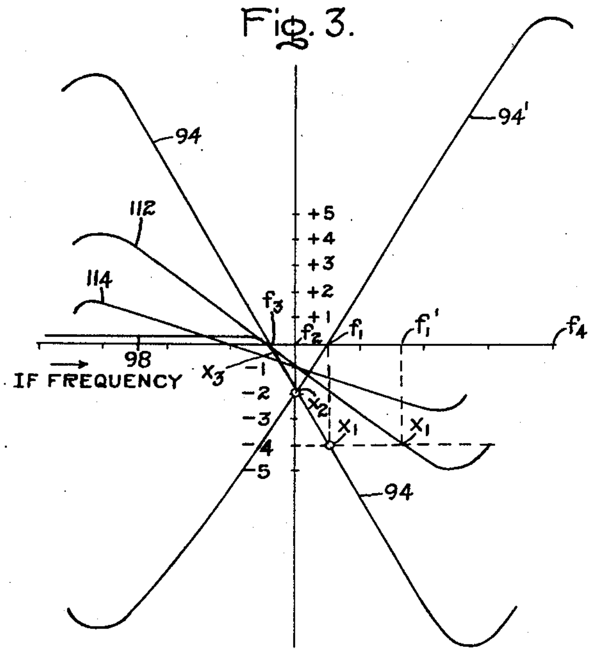
Figure 4:
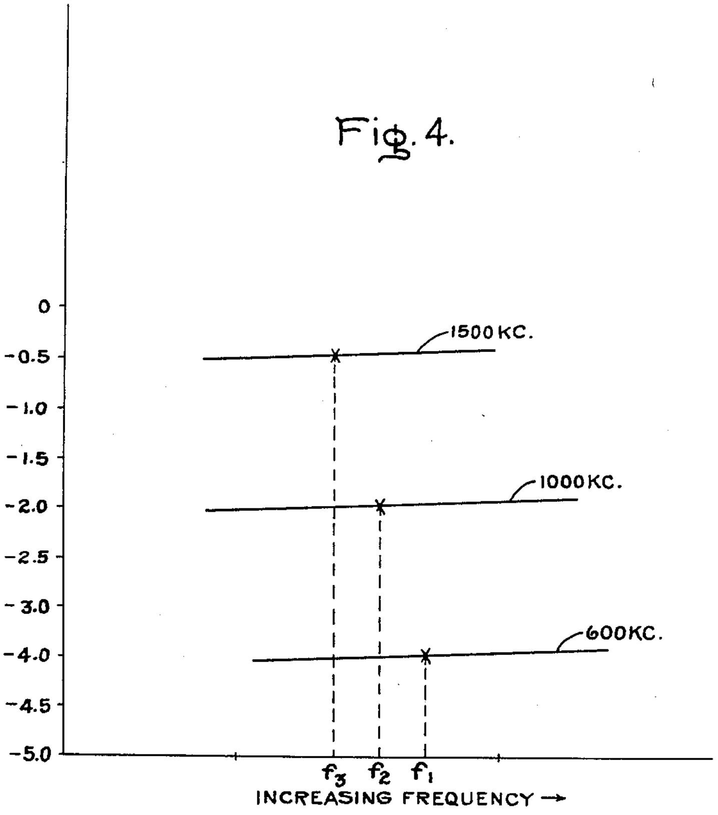
Figure 5:
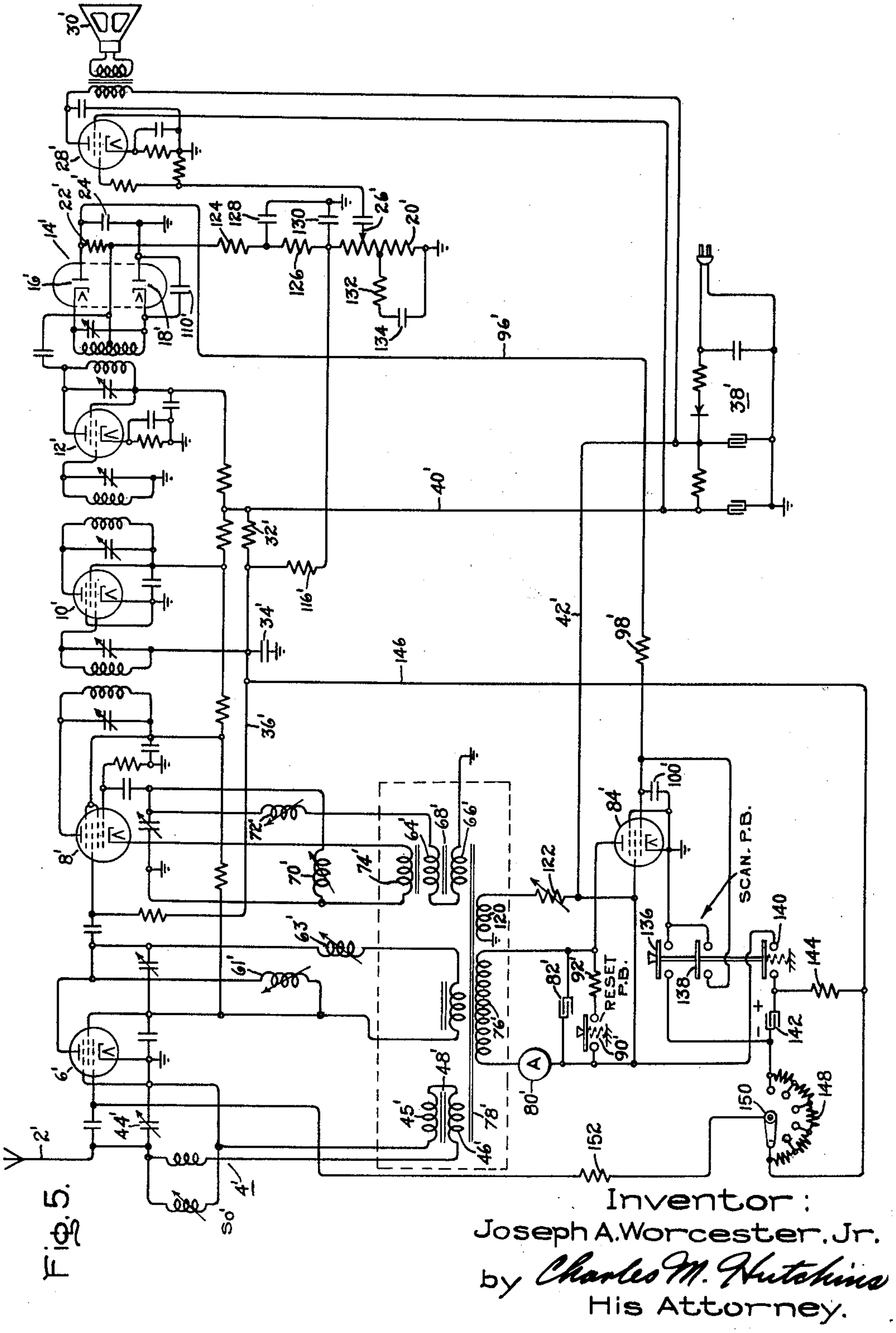

Figure 3 contains graphs of characteristics that may be assumed by the frequency discriminator shown in Figures 1 and 2 and is presented for purposes of explaining the overall operation of the invention;

Figure 4 contains graphs showing the relationship between the A.F.C. voltage and the frequency to which the receiver is tuned by the control voltage, and Figure 5 illustrates another receiver embodying certain features of this invention not illustrated in Figure 1.

In the receiver illustrated by way of example in Figure 1, the standard components are as follows. Signals are collected by an antenna 2 that is tuned to resonance at the frequency of the desired signal by a parallel tuned circuit 4. The antenna is tuned by a multibranch parallel resonant circuit 4 and is coupled to a radio frequency amplifier 6. A frequency converter 8 reduces the radio frequencies appearing at the output of the amplifier 6 to intermediate frequencies that are amplified by a suitable intermediate frequency amplifier, here shown as being comprised of two stages 10 and 12.

A frequency discriminator 14 is coupled to the output of the I.F. amplifier 12. In this particular example, the discriminator is of the Foster-Seeley type. As is well known to those skilled in the art, this circuit is comprised of a pair of diodes 16 and 18 to which the signals are applied in phase opposition. A pair of load resistors 20 and 22 shunted by a condenser 24 are connected between the cathodes of the diodes. The lower end of the resistor 20 is grounded and a variable tap 26 supplies suitable amounts of the audio signal detected by the discriminator to an audio amplifier 28 and a loudspeaker 30.

An automatic volume control voltage is developed by a smoothing network comprised of a resistor 32 and a condenser 34 in a manner well known to those skilled in the art. The A.V.C. voltage thus developed is applied via a bus 36 so as to control the gain of the R.F. stage 6, the converter stage 8 and the first I.F. stage 10.

Operating potentials for the various electron discharge devices are provided by any suitable power supply 38 via leads 40 and 42.

The following discussion relates to the details of a scan tuning arrangement constructed in accordance with the principles of this invention. The network 4 that tunes the antenna to a desired signal may be comprised of a variable trimmer condenser 44 and a scan tuning coil that in this particular example has two sections 45 and 46. If the core 48 on which these coils are mounted is not graded, then a shunt padder coil 50 and a series padder coil 52 may be required in order to achieve adequate tracking. Any variations on the degree of saturation of the core 48 varies the inductance of the tuning coils 45 and 46.

In the arrangement shown, the output circuit of the R.F. amplifying stage is tuned by a parallel resonant circuit of similar nature. A variable trimmer condenser 54 is connected in parallel with a scan tuning coil, here shown as being comprised of two sections 56 and 58 that are mounted on a core 60. A shunt coil 61 and a series coil 63 may be provided for tracking purposes. Any variation in the degree of saturation of the core 60 changes the inductance of the tuning coils 56 and 58 and hence the frequency to which the R.F. amplifying stage 6 is tuned.

The oscillator section of the converter 8 is tuned so as to reduce the signals selected by the R.F. amplifier 6 to the proper intermediate frequency. In this particular example, the frequency of the oscillator is determined by a parallel resonant circuit that may be comprised of a variable trimmer 62 and a scan tuning coil that is shown as having two sections 64 and 66 wound on a common core 68. The inductance of these tunings coils depends on the degree of saturation of the core 68. If need be, a shunt padding coil 70 and a series padding coil 72 may be added so as to obtain proper tracking. Grid-to-cathode feedback for the oscillator sections of the converter is secured by connecting a coil 74 to ground and arranging for it to be coupled to the coils 64 and 66.

The degree of saturation of the cores 48, 60 and 68 and hence the inductance of the associated tuning coils is controlled by the current in a saturation winding 76. The saturation winding is mounted on a core 78 that provides a magnetic path for the D.C. flux through the cores 48, 60 and 68 on which the tuning inductances are wound. In order to prevent harmful coupling between the various tuning coils, the construction shown in Figure 2 may be used. The cores 48, 60 and 68 are closed loops so as to form a path for the flux induced by signal current in the associated tuning coils. In this particular example, the core 78 is comprised of two parallel T sections 80 joined by a vertical section on which the saturation winding 76 is wound. Each projection of the T makes contact, as shown, with one end of the cores 48, 60 or 68 as the case may be. The projections of the other T section of the saturation core each make contact with the other end of one of the cores 48, 60 and 68. In this way the D.C. flux that is induced by D.C. current in the saturation coil 76 flows through the closed loop cores 48, 60 and 68. However, the A.C. flux in these cores does not flow to any extent in the core 78. The intercoupling of the tuning coils can be reduced still further if the permeance of the cores 48, 60 and 68 is much greater than the permeance of the core 76 that is comprised of the connected T sections.

A circuit for varying the current in the saturation coil 76 so as to scan the tuning of the receiver and to stop the tuning when a signal is received will now be described. In order to indicate the current in the saturation winding 76 and hence the signal frequency to which the receiver is tuned, an ammeter 80 or other current indicating device may be connected in series with the saturation winding 76. A condenser 82 is connected in parallel with the ammeter 80 and the saturation winding 76. One side of the condenser 82 is connected to a source of positive voltage via the lead 42 and the other is connected to ground through an electron discharge device 84. As shown, the electron discharge device 84 is a pentode that is operated on the flat portion of the plate current versus plate voltage characteristic so that variations in plate voltage do not affect the plate current. However, the electron discharge device could assume any form as long as means, such as a grid 88, are provided for controlling the amount of current flowing through it. A reset switch 90 and a current limiting resistor 92 are connected in series parallel relationship with the condenser 82.

It is apparent that the current flowing through the electron discharge device 84 may flow through the saturation winding 76, the condenser 82, or the reset switch 90. When the reset switch is closed, the condenser 82 is discharged and nearly all the current flowing through the electron discharge device flows through the switch so that very little, if any, current flows through the saturation winding. The degree of saturation of the core 78, is therefore, at a minimum, the inductance of the tuning coils at a maximum and the receiver is tuned to the low frequency end of its band. Upon release of the reset switch 90, the condenser 82 begins to charge, and as this charging action proceeds, more and more current flows in the saturation winding 76 and the receiver is tuned so as to respond to higher and higher frequencies.

The manner in which the scan tuner locks on a received signal is as follows. If the oscillator section of the mixer 8 and the RF tuning elements are adjusted so that the oscillator frequency is above the frequency of the signal to be selected, and if the scan tuning gradually increases the frequency of the oscillator in a manner set forth above, the I.F. frequency produced in response to a received signal starts at a low value and increases to a higher value. As illustrated by a curve 94 of Figure 3, the control voltage produced by the discriminator 14 is positive with respect to ground for the lower values of the I.F. frequency applied to it, and as the I.F. frequency increases to higher values, the control voltage becomes increasingly negative with respect to ground. The control voltage is applied to the grid 88 of the electron discharge device 84 via a lead 96 and a resistor 98 and appears across a condenser 100 that is coupled between the cathode 102 and the grid 88. When the control voltage is positive, the grid 88 of the electron discharge device 84 draws current so that the resistance between the grid and the grounded cathode 102 is greatly reduced. The ratio of this grid-to-cathode resistance to the internal resistance of the discriminator 14, which is approximately equal to the total resistance of the resistors 20 and 22, is so small that the actual grid-to-cathode voltage is extremely small as indicated by the curve 98 of Figure 3. When the control voltage is negative, this grid-to-cathode resistance is very high so that nearly all the control voltage is applied between the grid and cathode.

For purposes of illustration only assume that the first signal received as the receiver is scan tuned lies in the low end of the tuning range and has a frequency of 600 kc. Examination of the 600 kc. curve of Figure 4, which is a plot of the I.F. frequency produced in response to an R.F. signal of 600 kc. as a function of the control voltage applied to the grid 88 of the electron discharge device 84, shows that when the control voltage is −4 volts, the I.F. frequency is F1. This operating point is designated by X1. As illustrated by Figure 3, an I.F. frequency of F1 causes the discriminator 14 to produce a control voltage of −4 volts. That this is a stable condition of operation can be determined by assuming that there is a drift in the frequency of the oscillator section of the mixer 8. If the drift is toward a higher frequency, the control voltage becomes more negative than −4 volts (see curve 94 of Figure 3) so as to reduce the frequency of the oscillator and hence the I.F. frequency (see the 600 kc. curve of Figure 4). If the oscillator drifts to a lower frequency, a lower I.F. frequency is produced and the resulting less negative control voltage increases the frequency of the oscillator so as to cause the mixer to again produce the intermediate frequency F1.

The following discussion relates to the relationship between various components of the receiver that produce the most desirable operating characteristics.

In order to prevent intermediate frequencies from reaching the audio output lead 26, a bypass condenser 110 is connected in parallel with the audio detector diode 18.

In order that the tuning control exercised by the discriminator 14 may be responsive to the I.F. frequency produced as the receiver approaches a locked-in position, the time constant of the control circuit that applies the control voltage to the grid 88 of the electron discharge device 84 must be sufficiently large to remove the audio signal. Otherwise, the tuning will vary with the amplitude of the audio signal. In the particular embodiment of the invention shown in Figure 1, this time constant is affected by the capacitance of the condensers 24 and 100 and the resistances of the resistors 20, 22, and 98.

If the control circuit is required to have such a time constant, it is apparent that after the application of an I.F. frequency to the discriminator 14 upon receipt of a signal, a finite amount of time is required to build up the corresponding control voltage. Therefore, if the scan tuning provided by the charging of the condenser 82 is too fast, the I.F. frequency produced in response to a given received signal may be outside of the peaks of the discriminator characteristic before the control circuit builds up sufficient voltage to lock it in. In order to lock on a signal, the proper control voltage must be reached before the I.F. frequency has passed outside of the peaks of the discriminator characteristic. If the scanning is too fast, the receiver will not lock on any signal. However, from a practical point of view the scan from one end of the band to the other should be on the order of several seconds, say from five to ten seconds, so that there is plenty of time for the control voltage to build up sufficiently to lock the receiver on a signal.

If it is desired that the receiver of Figure 1 lock on received signals exceeding a given level or amplitude and not lock on signals below this level, means may be provided for decreasing the overall gain of the receiver. In this particular embodiment of the invention, the means is a stepped rheostat 118 connected between the cathode of the radio frequency amplifier 6 and ground. The greater the amount of resistance between these points, the greater is the negative bias on the amplifier so that stronger signals are required to cause the receiver to lock in the manner previously described.

In order to advance the tuning of receivers to a signal having a greater frequency, means are provided for removing the bias established by the control voltage at the grid 88. When the bias is removed, the amount of current flowing through the electron discharge device 84 is permitted to increase and the charging of the condenser 82 is resumed. Just as before, the charging of the condenser 82 causes more current to flow in the saturation winding 76 and thus increase the frequency to which the receiver is tuned. It is only necessary that the bias be removed in this manner for sufficient time to allow the scan tuning to proceed to a point where the I.F. frequency produced by the station on which the receiver was previously locked lies outside of the control range of the discriminator 14. Otherwise the discriminator might again lock the receiver on the same signal. Various means, apparent to those skilled in the art, may be used for removing the bias, but in this particular embodiment of the invention, the means is comprised of a switch 104 connected in series with a resistor 106 between the lead 96 and the junction of the resistors 20 and 22. An instant after the switch is closed, the bias voltage existing across the condenser 100 is dissipated by discharge to ground through the switch 104, the resistor 106 and the resistor 20. As long as the switch 104 is closed, the discriminator is unable to lock the tuning on a received signal. However, the scan tuning starts the instant that the switch 104 is closed and, therefore, in order not to skip station, the switch 104 should be closed just long enough to permit the scan tuner to pull out of the control range of the discriminator for reasons previously set forth.

Assume that the next received signal has a frequency of 1000 kc. Examination of Figure 3 shows that when the oscillator is at such a frequency as to produce an I.F. frequency F2 that the discriminator produces a control voltage of −2 volts. Examination of Figure 4 shows that this control voltage is precisely that required to tune the oscillator in such manner that the I.F. frequency F2 is produced. The stable operating point of the discriminator is then X2 and the automatic frequency control action previously described holds the I.F. frequency to F2. If the scan switch 104 is closed again, the frequency of the next signal received may be 1500 kc. Examination of the curves of Figures 3 and 4 show that a stable operating point of the discriminator for the signal is X3.

It is apparent, therefore, that the I.F. frequency at which the receiver is locked is higher for low frequency signals than for high frequency signals as F1, >F2, >F3. The discriminator may be so tuned that the I.F. frequency F2 that is produced when the receiver is locked on a mid-band signal of 1000 kc., is the central frequency of the I.F. pass-band. Thus, for low signal frequencies, the receiver is slightly mistuned so that the I.F. frequencies are above the central frequency of the I.F. pass-band and for high signal frequencies the receiver is slightly mistuned so that the I.F. frequencies are below the central frequency of the I.F. pass-band. However, the discriminator sensitivity may be such as to produce a sufficient range of control voltage for small variations in the I.F. frequencies. If this is done, the mistuning is not noticeable.

If it is desired to cause the receiver to rescan from the low end of the band, the reset switch 90 is closed long enough to discharge the condenser 82. When the reset switch is opened, the scan tuning proceeds in a manner previously set forth. While the condenser 82 is discharging, the current in the saturation winding 76 is quickly reduced so that the receiver is scan-tuned from the high end of the band to the low end. It might at first seem that the receiver could lock on a received signal. However, regardless of the voltage supplied by the discriminator during reverse scanning, the current through the saturation winding 76 is not changed to any great extent regardless of the voltage output of the discriminator because it is short-circuited by the switch 90. Furthermore, any charge that might appear on the condenser 100 as a result of the rescanning of the tuner through a station is quickly dissipated as the R.C. time constant of its circuit is small.

The following discussion relates to the operation of the receiver upon the receipt of weak signals. For reasons well known to those skilled in the art, the sensitivity of a discriminator generally decreases with the amplitude of the signals applied to it so that the characteristic may be as indicated by the curve 112 of Figure 3. Assume once more that a 600 kc. signal is received and that a —4 volts control voltage is required to lock the tuning apparatus at a stable point. Under these conditions the —4 volts control voltage will be obtained at a frequency F1′ and the stable operating point will be at X1′ on the curve 112. The I.F. frequency at the stable point is, therefore, much higher than before and may even be so close to the edge of the I.F. pass-band as to reduce the amplitude of one of the sidebands. When this occurs, the audio reproduction is poor.

As the strength of the received signal gets less and less, the point of stable operation is further and further away from the central frequency of the I.F. pass-band. If the amplitude of the 600 kc. signal decreases far enough, the characteristic of the discriminator may be as indicated by the curve 114 of Figure 3, in which event the discriminator is never able to develop the control voltage of —4 volts required to lock on the 600 kc. signal. However, the lesser control voltage required for locking onto signals toward the center of the tuning range may be built up sufficiently to lock the receiver on signals within the central portion of the tuning range.

The minimum amplitude of signals required to lock the receiver tuning is also affected by the time constants of the control circuit. As is well known, less time is required to charge a circuit having a given time constant to a finite voltage such as the —4 volts in the example above, when the charging potential is large than when it is small. Therefore, as the scan tuner attempts to pass the stable point X1′ of operation for a weak signal, the control voltage does not build up as fast as for a strong signal. Hence once again the scan tuner may produce an I.F. frequency that lies outside the peaks of the discriminator before the required control voltage is built up.

The following discussion relates to a novel manner of incorporating automatic volume control in a receiver that is scan tuned in accordance with the principles of the invention. A.V.C. is generally required to prevent strong signals from producing undesirable amounts of sound as the receiver is being tuned to the signal. However, if A.V.C. is applied to the receiver of this invention, weak signals that normally are just strong enough to be locked in are further weakened so that the receiver cannot lock on them for reasons just explained. The operator may wish to lock on a weak signal in spite of static and loud blasts of volume encountered when strong signals are tuned in.

Therefore, in accordance with another feature of this invention, delayed A.V.C. is provided so as to permit the receiver to have a maximum gain for signals that with ordinary A.V.C. would be reduced to a point where the receiver could not lock on them. Although ordinary delayed A.V.C. circuits might be used for this purpose, the following description relates to a delayed A.V.C. circuit that is incorporated in the receiver of this invention in a novel manner that requires the addition of but a single resistor 116. This rather large resistor is connected between a source of positive voltage, herein indicated by way of example as being B+, and the A.V.C. bus 36. If the A.V.C. bus 36 were disconnected from the grids of the various tubes, the voltage on the A.V.C. has a positive value determined by the relationship between the value of the resistor 116 and the sum of the values of the resistors 32 and 20 and may by way of example be 15 volts. Now if the A.V.C. bus 36 is connected to the grids of the tubes, as shown, grid current flows. However, because the resistor 116 is large in comparison with the grid-to-ground resistance, only a slight positive voltage of a few tenths of a volt appears on the bus 36. Therefore, the bus 36 cannot have a negative voltage such as is required to reduce the gain of the receiver until the received signals are of such amplitude as to produce a voltage at the junction of the resistors 20 and 22 that is in excess of 15 volts. The signal level at which A.V.C. action begins to lower the gain of the receiver is preferably set at a point in excess of the signal level required to lock the tuning of the receiver. The level is largely determined by the ratio between the resistance of the resistor 116 and the sum of the resistance of the resistors 32 and 20.

A receiver incorporating other features of the invention is shown in Figure 5, the components corresponding to Figure 1 being indicated by the same numbers primed. Scanning is initiated as before by a reset switch 90′, a condenser 82′ and a saturation winding 76′. However, the receiver is made to scan in the reverse direction from the scanning of the receiver in Figure 1, i.e., from the high frequency end of the band to the low frequency end. This is accomplished by connecting another saturation winding 120 in series with a resistor 122 between a source of fixed D.C. potential and ground. The additional saturation winding 120 is mounted on the core 78′ in such manner as to produce a fixed D.C. flux that opposes the variable flux produced by the saturation winding 76′. Hence at the beginning of the scan, when little or no current is flowing in the saturation winding 76′, enough flux may be established in the core 78′ to tune the receiver to the high end of the band. As the current through the saturation winding 76′ increases, the flux produced increases and reduces the net amount of flux in the core 78′. Hence, for reasons previously discussed, the oscillator section of the mixer 8 is reduced in frequency and tuning proceeds from the high end of the band to the low end of the band.

Tuning in this manner requires that the discriminator 14′ have a frequency versus voltage output characteristic 94′ as shown in Figure 3. Thus, as a signal is tuned in during the scanning operation, a positive control voltage is first produced and then as the tuning proceeds a little further, the control voltage becomes negative. A point of stable operation is established in a manner similar to that previously described in connection with Figure 1. In order to obtain such a characteristic, the diodes 16′ and 18′ are reversed as shown.

Various other changes have been made in the discriminator 14′ that do not affect the operation of the invention. A filter for removing the intermediate frequencies and comprised of resistors 124, 126 and condensers 128 and 130 is connected between the load resistor 22′ and the load resistor 20′. A base boost circuit comprised of a resistor 132 and a condenser 134 is connected in shunt with a portion of the resistor 20′.

It will be remembered that the gain of the receiver of Figure 1 can be set at any desired level by the rheostat 118. In this way it is possible to prevent the receiver from locking on signals that are below a given amplitude. However, it is possible that the receiver might lock on a marginal signal having the given amplitude and then scan to the next signal if the first signal should fade. Therefore, means are provided for reducing the gain of the receiver during the scanning operation and restoring the gain a short time later. Thus, once the receiver locks onto a signal it is not as apt to scan to the next signal during fading.

Various means for achieving this result may be used but the arrangement about to be described is simple, novel and efficient. Three normally open switches 136, 138, and 140 are ganged together. When closed, the switch 138 shunts the condenser 100′ so as to discharge the control voltage existing across it and permit the scanning to proceed to the next signal for reasons previously set forth. The closing of the switch 140 connects a positive voltage, here shown as that voltage appearing at the screen grid of the electron discharge device 84′ to the right hand side of a condenser 142. When the switch 136 is closed, the left hand side of the condenser is connected to ground. Thus, after these switches are momentarily closed, the control voltage is removed from the condenser 100' so as to permit scanning to be resumed, and the condenser 142 is charged in the polarity shown. A resistor 144 is connected between the right hand plate of the condenser 142 and the A.V.C. bus 36' via a lead 146. A tapped potentiometer 148 is connected between the left hand side of the condenser 142 and the lead 146. The tap 150 on the potentiometer 148 is connected via a resistor 152 to the grid of the amplifier in the R.F. stage 6'.

After the switches are released, the condenser 142 is charged as indicated so that a negative voltage is superimposed on any A.V.C. voltage appearing on the lead 146. As the condenser discharges through the potentiometer 148 and the resistor 144, the negative voltage at the tap 150 decreases. After an interval of time, just exceeding the time it takes to scan from one end of the band to the other, the condenser 142 is entirely discharged and the voltage at the tap 150 is the same as the A.V.C. voltage on the lead 146. This temporary negative voltage provided by the condenser 142 reduces the gain of the receiver during scanning by an amount dependent on the setting of the tap 150.

While I have illustrated a particular embodiment of my invention, it will of course be understood that I do not wish to be limited thereto since various modifications both in the circuit arrangement and in the instrumentalities may be made, and I contemplate by the appended claims to cover any such modifications as fall within the true spirit and scope of the invention.

What I claim as new and desire to secure by Letters Patent of the United States is:

1. In a radio receiver, scan-tuning means for progressively tuning the receiver from one end to the other of a frequency band containing a plurality of radio signals subject to fading, means for causing said scan-tuning means to stop whenever the receiver is tuned to a radio signal lying within said frequency band and having a signal strength exceeding a predetermined value, and means for preventing said scan-tuning means from stopping at a marginal radio signal having a signal strength so marginally above said predetermined value that when this signal fades the scan-tuning means would scan to a next signal, said last-named means comprising a gain-reducing means for reducing the gain of said receiver by an amount which is only enough to prevent the scan-tuning means from stopping when the receiver is tuned to said marginal radio signal, means for actuating said gain-reducing means whenever said scan-tuning means begins to scan, and means for causing said gain-reducing means to be effective for a time duration longer than the time required for said scanning means to scan uninterruptedly from said one end to the other of the frequency band.

2. In a radio receiver having an input circuit, scan-tuning means for progressively tuning the receiver from one end to the other of a frequency band containing a plurality of radio signals subject to fading, means for causing said scan-tuning means to stop whenever the receiver is tuned to a radio signal lying within said frequency band and having a signal strength exceeding a predetermined value, control means adapted to initiate the operation of said scan-tuning means, and means for preventing said scan-tuning means from stopping at a marginal radio signal having a signal strength so marginally above said predetermined value that when this signal fades the scan-tuning means would scan to a next signal, said last-named means comprising a capacitor, means connected to charge said capacitor when said control means is actuated for initiating the operation of said scan-tuning means, a resistor connected to form a discharge path for said capacitor whereby said capacitor discharges through said resistor while said scan-tuning means is operating, said resistor and capacitor having a large enough time constant so that the time required for said capacitor to discharge through said resistor is greater than the time required for said scan-tuning means to scan uninterruptedly from one end to the other of said frequency band, and an electrical connection between a point on said resistor and said input circuit for causing the gain of said input circuit to be reduced in response to the charge on said capacitor, the charge on said capacitor having a value such that the gain of said input circuit is reduced only enough to prevent the scan-tuning means from stopping when the receiver is tuned to said marginal radio signal.

References Cited in the file of this patent

UNITED STATES PATENTS

| | | |
|---|---|---|
| 1,360,462 | Stoekle | Nov. 30, 1920 |
| 2,135,560 | Carlson | Nov. 8, 1938 |
| 2,135,599 | Peterson | Nov. 8, 1938 |
| 2,174,566 | Case | Oct. 3, 1939 |
| 2,499,584 | Hills | Mar. 7, 1950 |
| 2,546,401 | Nicholson et al. | Mar. 27, 1951 |
| 2,581,202 | Post | Jan. 1, 1952 |
| 2,601,384 | Goodrich | June 24, 1952 |
| 2,639,372 | Colgan | May 19, 1953 |
| 2,659,019 | Clayton | Nov. 10, 1953 |